United States Patent [19]

Kondo

[11] Patent Number: 5,802,007

[45] Date of Patent: Sep. 1, 1998

[54] SEMICONDUCTOR DEVICE HAVING REDUNDANCY CONTROLLING CIRCUIT FOR SELECTIVELY CONNECTING SIGNAL PATHS TO PIN

[75] Inventor: Yasuo Kondo, Tokyo, Japan

[73] Assignee: NEC Corporation, Tokyo, Japan

[21] Appl. No.: 751,729

[22] Filed: Nov. 18, 1996

[30] Foreign Application Priority Data

Nov. 17, 1995 [JP] Japan ................... 7-323628

[51] Int. Cl.⁶ ................... H01L 27/04; G01R 31/26
[52] U.S. Cl. ................... 365/230.06; 365/189.03; 365/201; 365/189.08
[58] Field of Search ................... 365/200, 201, 365/230.01, 230.06, 189.01, 189.03, 189.08

[56] References Cited

U.S. PATENT DOCUMENTS 5,502,677  3/1996  Takahashi ................... 365/201

FOREIGN PATENT DOCUMENTS 62-229966 A  10/1987  Japan.

Primary Examiner—Viet Q. Nguyen
Attorney, Agent, or Firm—Sughrue, Mion, Zinn, Macpeak & Seas, PLLC

[57] ABSTRACT

A semiconductor device has change-over circuits respectively connected between data buses and a plurality of data pins, and one of the change-over circuits changes a signal path between a defective signal line to associated data pin to another signal path between a non-defective signal line the associated data pin so as to allow a common test program sequence to check the semiconductor device whether to be an excellent product or a partially defective product.

8 Claims, 3 Drawing Sheets

SEMICONDUCTOR DEVICE HAVING REDUNDANCY CONTROLLING CIRCUIT FOR SELECTIVELY CONNECTING SIGNAL PATHS TO PIN

FIELD OF THE INVENTION

This invention relates to a semiconductor device and, more particularly, to a semiconductor device having a redundancy controlling circuit for selectively connecting signal paths to pins.

DESCRIPTION OF THE RELATED ART

When an integrated circuit is completed on each small area on a semiconductor wafer, the manufacturer checks the products to see whether or not the integrated circuit on each small area is excellent. When the manufacturer finds a defective circuit in the integrated circuit, the product is decided to be defective. However, if the defective circuit does not affect the function defined by another customer's specification, the manufacturer uses the product as a partially defective product. For example, assuming now that a semiconductor memory device has a plurality of memory cell arrays one of which is defective for fully storing data bits, the semiconductor memory device is a partially defective product. However, if the remaining memory cell arrays are sufficient enough to provide a data storage for another customer, the partially defective product is available for the customer. Thus, the test and the classification are important steps in a fabrication process of a semiconductor integrated circuit device.

FIG. 1 illustrates a flow of the prior art test/classification sequence for a semiconductor memory device. The semiconductor memory device is assumed to have four output data pins. If the memory cell arrays connected to the four output data pins are perfect, the product is classified as an excellent product. Even if one of the output data pins is connected to a defective memory cell array, the product is used as a partially defective product. The four output data pins are hereinbelow referred to as "OUT1", "OUT2", "OUT3" and "OUT4".

In order to classify the products into the excellent product, the partially defective products and the defective product, the manufacturer passes the products through the prior art test/classification sequence. The prior art test/classification sequence has step SP1 of checking a product to see whether or not the integrated circuit is excellent and steps SP2 to SP5 of checking the product to see whether or not the integrated circuit is partially defective.

A plurality of test programs such as the first test program and the second test programs are successively executed by a testing apparatus (not shown) in step 1. Each of the test programs causes the testing apparatus to supply a test pattern or patterns to the integrated circuit of a given product. The integrated circuit produces output signals at the output data pins OUT1 to OUT4, and the testing apparatus compares the output signals at the output data pins OUT1 to OUT4 with expected logic levels so as to diagnose the integrated circuit. If the integrated circuit produces the output signals matched with the expected logic levels in all the test programs, the testing apparatus diagnoses the given product to be excellent, and the product is classified into the excellent product.

On the other hand, when the given product fails to produce the expected output signals in at least one test program relating to one of the output data pins OUT1 to OUT4, the given product is subjected to a series of test programs in step SP2 to see whether or not the trouble relates to the output data pin OUT1. A plurality of test programs are also executed by the testing apparatus in step SP2, and mask the output data signal at the data output pin OUT1. For this reason, if the output data signals at the output data pins OUT2, OUT3 and OUT4 are matched with the expected logic levels, the given product is classified in the partially defective product troubled with "OUT1".

If the output data signal is still mismatched with the expected logic level in at least one test program, the product is not troubled with the output data pin OUT1, and the given product is subjected to further diagnosis in step SP3 to see whether or not the trouble relates to the output data pin OUT2. A plurality of test programs are also executed by the testing apparatus in step SP3, and mask the output data signal at the data output pin OUT2. For this reason, if the output data signals at the output data pins OUT1, OUT3 and OUT4 are matched with the expected logic levels, the given product is classified in the partially defective product troubled with "OUT2".

On the other hand, if the output data signal is still mismatched with the expected logic level in at least one test program, the product is not troubled with the output data pins OUT1 and OUT2, and the given product is subjected to further diagnosis in step 4 to see whether or not the trouble relates to the output data pin OUT3. A plurality of test programs are also executed by the testing apparatus in step SP3, and mask the output data signal at the data output pin OUT3. For this reason, if the output data signals at the output data pins OUT1, OUT2 and OUT4 are matched with the expected logic levels, the given product is classified in the partially defective product troubled with "OUT3".

On the other hand, if the output data signal is still mismatched with the expected logic level in at least one test program, the product is not troubled with the output data pins OUT1, OUT2 and OUT3, and the given product is subjected to further diagnosis in step 4 to see whether or not the trouble relates to the output data pin OUT4. A plurality of test programs are also executed by the testing apparatus in step SP4, and mask the output data signal at the data output pin OUT4. For this reason, if the output data signals at the output data pins OUT1, OUT2 and OUT3 are matched with the expected logic levels, the given product is classified in the partially defective product troubled with "OUT4".

However, if the output data signal is still mismatched with the expected logic level in at least one test program, the product is not troubled with more than one output data pin, and the given product is classified in the defective product.

The test programs executed in steps SP2 to SF4 are identical with the test programs executed in step SP1 except for the masking instruction for one of the output data signals, and are modified on the basis of the test programs executed in step SP1.

Thus, the prior art test/classification sequence requires a plurality of sets of test programs analogous to one another, and the execution of these test programs prolongs the test/classification sequence.

SUMMARY OF THE INVENTION

It is therefore an important object of the present invention to provide a semiconductor device which makes a test/classification sequence simple.

To accomplish the object, the present invention proposes to supply a non-defective data signal on a signal line to a plurality of signal pins one of which is associated with another signal line for a defective data signal.

3

In accordance with the present invention, there is provided a semiconductor device fabricated on a semiconductor substrate comprising an internal circuit connected to a plurality of signal lines, a plurality of signal pins for communicating with an external device through electric signals, a plurality of change-over circuits respectively associated with the plurality of signal pins, and responsive to control signals for selectively connecting the plurality of signal lines to the associated signal pins, each of the plurality of change-over circuits being connected between two of the plurality of signal lines and associated one of the plurality of signal pins, and a controlling signal generating means storing pieces of control data information representative of at least one of the plurality of signal lines to be disconnected from the plurality of signal pins for supplying the control signals to the plurality of change-over circuits, thereby causing the plurality of change-over circuits to connect the plurality of signal lines except for the at least one of the plurality of signal lines to the plurality of signal pins.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENT

Figure 1:
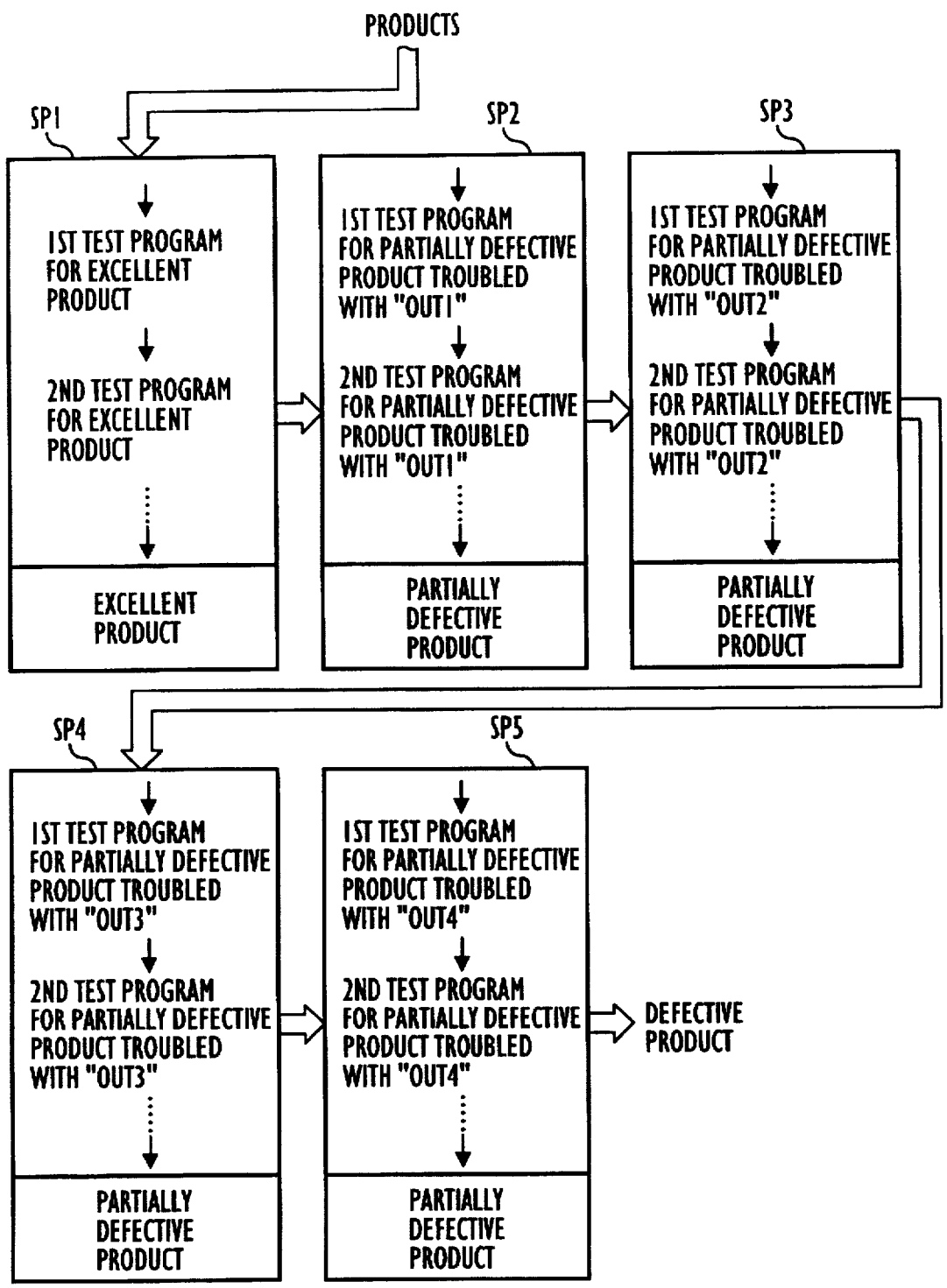
FIG. 1 is a flow chart showing the prior art test/classification sequence for the excellent/partially defective/defective products.
Figure 2:
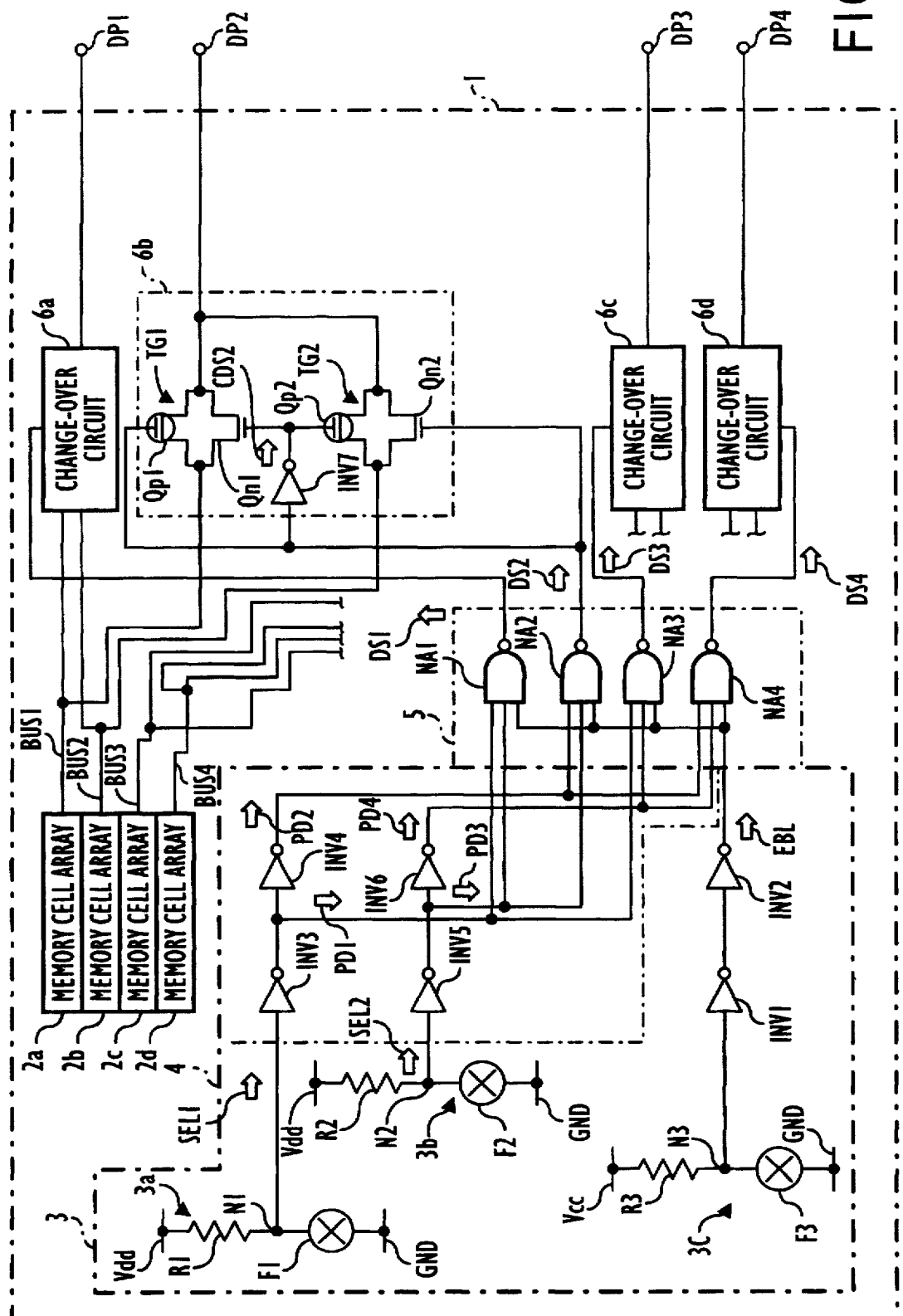
FIG. 2 is a circuit diagram showing the circuit arrangement of a semiconductor integrated circuit device according to the present invention.

Referring to FIG. 2 of the drawings, a semiconductor memory device embodying the present invention is fabricated on a part 1 of a semiconductor wafer. The semiconductor memory device comprises four memory cell arrays 2a, 2b, 2c and 2d, four data pins DP1, DP2, DP3 and DP4, a programming circuit 3, a predecoder 4 connected to the programming circuit 3, a decoder 5 connected to the predecoder 4 and four change-over circuits 6a, 6b, 6c and 6d connected between the four memory cell arrays 2a to 2d and the data pins DP1 to DP4. The memory cell arrays 2a, 2b, 2c and 2d are connected to data buses BUS1, BUS2, BUS3 and BUS4, respectively. In this instance, the memory cell arrays 2a to 2d serve as an internal circuit, and the programming circuit 3, the predecoded circuit 4 and the decoder 5 as a whole constitute a control signal generating means.

The programming circuit 3 includes three non-volatile memory circuits 3a, 3b and 3c and two inverters INV1 and INV2. The three non-volatile memory circuits 3a, 3b and 3c are implemented by series combinations of resistors R1/R2/R3 and fuse elements F1/F2/F3, and are connected between a positive power voltage line Vdd and a ground voltage line GND.

The non-volatile memory circuits 3a and 3b have respective output nodes N1/N2 between the resistors R1/R2 and the fuse elements F1/F2, and produce selecting signals SEL1/SEL2 at the output nodes N1/N2 depending upon the status of the fuse elements F1/F2. When the fuse elements F1/F2 provide current paths between the resistors R1/R2 and the ground line GND, the selecting signals SEL1/SEL2 are in a

4 low level corresponding to logic "0" level. On the other hand, if the fuse element F1 or F2 is broken, the output node N1 or N2 is electrically isolated from the ground line GND, and the non-volatile memory circuit 3a or 3b changes the selecting signal SEL1 or SEL2 to a high level corresponding to logic "1" level. The programming circuit 3 specifies one of the change-over circuits 6a to 6d with a combination of the selecting signals SEL1/SEL2, and the change-over circuit specified by the programming circuit 3 changes the memory cell array connected to the associated data pin DP1/DP2/DP3/DP4 as will be described in detail later herein.

The non-volatile memory circuit 3c has a signal node N3 between the resistor R3 and the fuse element F3, and the inverters INV1 and INV2 are connected in series to the signal node N3. The non-volatile memory circuit 3c changes an enable signal EBL between logic "1" level representative of enable state and logic "0" representative of disable state depending upon the status of the fuse element F3. When a product is decided to be the partially defective product, the fuse element F3 is broken, and the enable signal EBL is changed to logic "1" level. However, the fuse element F3 of the excellent product is not broken, and the enable signal EBL remains inactive low.

The predecoded circuit 4 includes inverters INV3/INV4 connected in series to the node N1 and inverters INV5/INV6 connected in series to the node N2. The predecoded circuit 4 is responsive to the selecting signals SEL1/SEL2 so as to produce predecoded signals PD1, PD2, PD3 and PD4, and the predecoded signals PD1 to PD4 are supplied to the decoder circuit 5.

The decoder circuit 5 is implemented by three-input NAND gates NA1, NA2, NA3 and NA4, and supplies decoded signals DS1, DS2, DS3 and DS4 to the four change-over circuits 6a to 6d, respectively. The enable signal EBL is supplied to the NAND gates NA1 to NA4, and the four predecoded signals PD1 to PD4 are selectively distributed to the NAND gates NA1 to NA4. When the semiconductor memory device is decided to be the partially defective product, the enable signal EBL is changed to active logic "1" level, and the decoder circuit 5, i.e., the NAND gates NA1 to NA4 are enabled with the enable signal EBL of logic "1" level. The enabled NAND gates NA1 to NA4 are responsive to the decoded signals PD1 to PD4, and one of the decoded signals DS1 to DS4 is changed to active low level or logic "0" level.

The decoded signals DS1 to DS4 are respectively supplied to the change-over circuits 6a to 6d, and each of the change-over circuits 6a to 6d is connected to two of the data buses BUS1 to BUS4. Namely, the change-over circuit 6a is connected between the data buses BUS1/BUS2 and the data pin DP1, and the change-over circuit 6b is connected between the data buses BUS1/BUS2 and the data pin DP2. The change-over circuit 6c is connected between the data buses BUS3/BUS4 and the data pin DP3, and the change-over circuit 6d is connected between the data buses BUS3/BUS4 and the data pin DP4. Thus, each data bus is connectable to two data pins.

The change-over circuit 6a to 6d are similar in circuit arrangement to one another, and, for this reason, only the change-over circuit 6b is described in detail. The change-over circuit 6b includes a first transfer gate TG1 connected between the data bus BUS2 and the data pin DP2, a second transfer gate TG2 connected between the data bus BUS1 and the data pin DP2 and an inverter INV7 for producing a complementary signal CDS2 of the decoded signal DS2. The first transfer gate TG1 is implemented by a parallel combination of a p-channel enhancement type switching transistor Qp1 and an n-channel enhancement type switching transistor Qn1. Decoded signal DS2 and complementary signal CDS2 are supplied to the gate electrode of the p-channel enhancement type switching transistor Qp1 and the n-channel enhancement type switching transistor Qn1 respectively. The second transfer gate TG2 is implemented by a parallel combination of a p-channel enhancement type switching transistor Qp2 and an n-channel enhancement type switching transistor Qn2. Decoded signal DS2 and complementary signal CDS2 are supplied to the gate electrode of the n-channel enhancement type switching transistor Qn2 and the p-channel enhancement type switching transistor Qp2 respectively. Thus, the decoded signal DS2 and the complementary signal CDS2 are inversely supplied to the first transfer gate TG1 and the second transfer gate TG2, and one of the first and second transfer gates TG1/TG2 provides a signal path to the data pin DP1.

Figure 3:
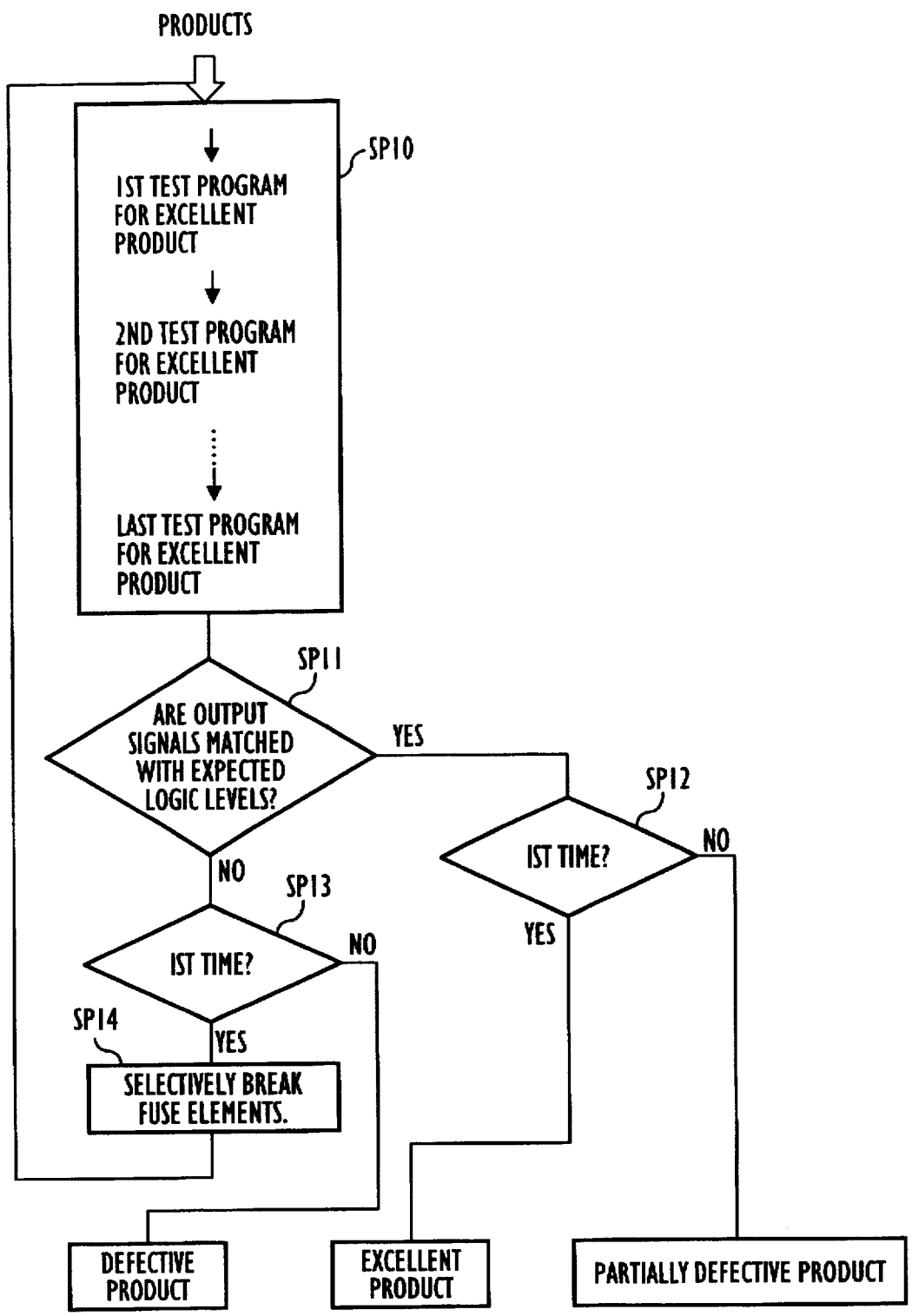
FIG. 3 is a flow chart showing a test/classification sequence for the semiconductor integrated circuit device.

Upon completion of a process of fabricating the semiconductor memory device, products are subjected to a test/classification as shown in FIG. 3. A testing apparatus (not shown) sequentially passes each product through the first test program for the excellent product, the second test program for the excellent product, . . . and the last test program for the excellent product as by step SP10. The testing apparatus energizes the semiconductor memory device, and supplies a test pattern to signal pins (not shown) of the semiconductor memory device in each test program. The semiconductor memory device produces four output data signals, and supplies them through the data pins DP1 to DP4 to the testing apparatus. The testing apparatus compares the output data signals with expected logic levels so see whether or not the semiconductor memory device has a defective circuit or circuits as by step SP11.

If all the output data signals are matched with the expected logic levels, the answer at step SP11 is given affirmative, and the testing apparatus checks the history to see whether or not the semiconductor memory device has been subjected to the test/classification sequence before. If the test/classification was carried out for the first time, the answer at step SP12 is given affirmative, and the semiconductor memory device is classified in the excellent product.

On the other hand, if there is a mis-match between one of the output data signals and the expected logic level, the answer at step SP11 is given negative, and the testing apparatus checks the history to see whether or not the semiconductor memory device has been subjected to the test/classification sequence before as by step SP13. If the test/classification was carried out for the first time, the answer at step SP13 is given affirmative. Then, the manufacturer selectively breaks the fuse elements F1 to F3 as by step SP14, and the semiconductor memory device is subjected to the test/classification sequence at step SP10, again.

The memory cell array 2b is assumed to be defective. The manufacturer breaks the fuse elements F1 and F3, and changes the nodes N1 and N3 to the high voltage level. The non-volatile memory circuit 3a changes the selecting signal SEL1 to logic "1" level, and the non-volatile memory circuit 3b keeps the other selecting signal SEL2 in logic "0" level. The non-volatile memory circuit 3c changes the enable signal EBL to active logic "1" level.

In this situation, only the NAND gate NA2 changes the decoded signal DS2 to the low level, and the decoded signal DS2 at the low level and the complementary signal CDS2 at the high level cause the first transfer gate TG1 to turn on and the second transfer gate TG2 to turn off. As a result, the data bus BUS1 is connected through the change-over circuits 6a and 6b to the data pin DP1, and the data bus BUS2 is electrically isolated from the data pin DP2. The other change-over circuits 6c and 6d continuously connect the data buses BUS3 and BUS4 to the data pins DP3 and DP4, respectively. Thus, the memory cell array 2a supplies the output data signal representative of the access data bit to both of the data pins DP1/DP2, and the memory cell arrays 2c/2d supply the output data signals to the data pins DP3/DP4, respectively.

While the testing apparatus is testing the semiconductor memory device for the second time, data bits of logic "1" level are written into the memory cell arrays 2a to 2d, and, thereafter, are read out from the memory cell arrays 2a to 2d to the data buses BUS1 to BUS4. Although the defective memory cell array 2b changes the data bit from logic "1" to logic "0", the data bit of logic "1" level is supplied from the memory cell array 2a through the change-over circuits 6a and 6b to the data pins DP1/DP2. As a result, the output data signals at the data pins DP1 to DP4 are matched with the expected logic level "1", and the answer at step SP11 is changed to affirmative.

Thereafter, the testing apparatus checks the history to see whether or not the semiconductor memory device has been subjected to the test/classification sequence before. The semiconductor memory device has been subjected to the test/classification twice, and the answer at step SP12 is given negative. The testing apparatus classifies the semiconductor memory device into the partially defective product.

On the other hand, if the output data signals at the data pins DP1 to DP4 are still mis-matched with the expected logic level, the semiconductor memory device includes more than one defective memory cell array, and the answer at step SP11 is given negative. The testing apparatus checks the history to see whether or not the semiconductor memory device has been subjected to the test/classification sequence before. The test/classification has been carried out for twice, and the answer at step SP13 is given negative. Then, the testing apparatus classifies the semiconductor memory device into the defective product.

As will be appreciated from the foregoing description, the semiconductor memory device according to the present invention isolates the data pin from the data bus connected to the defective memory cell array, and connects the data pin to the excellent memory cell array. As a result, the test/classification sequence is shared between the excellent product and the partially defective product, and the manufacturer is released from preparation of test programs for the partially defective products.

Although particular embodiments of the present invention have been shown and described, it will be obvious to those skilled in the art that various changes and modifications may be made without departing from the spirit and scope of the present invention.

For example, the present invention is applicable to any kind of semiconductor integrated circuit device in so far as it has a plurality of data pins.

If customer's specification allows a semiconductor device to have more than one defective output signal, more than one change-over circuit isolate associated data pins from data signal lines connected to defective circuits, and connects the associated data pins to other data signal lines connected to excellent circuits.

What is claimed is:

1. A semiconductor device fabricated on a semiconductor substrate, comprising:

an internal circuit connected to a plurality of signal lines;

a plurality of signal pins for communicating with an external device through electric signals;

a plurality of change-over circuits respectively associated with said plurality of signal pins, and responsive to control signals for selectively connecting said plurality of signal lines to the associated signal pins, each of said plurality of change-over circuits being connected between two of said plurality of signal lines and associated one of said plurality of signal pins; and a control signal generating means storing pieces of control data information representative of at least one of said plurality of signal lines to be disconnected from said plurality of signal pins for supplying said control signals to said plurality of change-over circuits, thereby causing said plurality of change-over circuits to connect said plurality of signal lines except for said at least one of said plurality of signal lines to said plurality of signal pins.

2. The semiconductor device as set forth in claim 1, in which said control signal generating means includes a memory means storing said pieces of control data information for producing selecting signals representative of said at least one of said signal lines and an enable signal, and a decoding means connected to said memory means and enabled with said enable signal for decoding said selecting lines into said control signals.

3. The semiconductor device as set forth in claim 2, in which said memory means has a plurality of memory circuits connected between a first power voltage line and a second power voltage line different in power voltage level from said first power voltage line, and said plurality of memory circuits respectively produce said enable signal and said selecting signals.

4. The semiconductor device as set forth in claim 3, in which each of said plurality non-volatile memory circuits is implemented by a series of a resistor element and a fuse element connected between said first power voltage line and said second power voltage line, and one of said enable signal and said selecting signals is produced at a node between said resistor element and said fuse element.

5. The semiconductor device as set forth in claim 2, in which said decoding means has a predecoder connected to said memory means and responsive to said selecting signals for producing complementary signals from said selecting signals, and a decoder connected to said predecoder and responsive to said selecting signals and said complementary signals for producing said control signals.

6. The semiconductor device as set forth in claim 1, in which each of said change-over circuits has a first transfer gate connected between one of said plurality of signal lines and associated one of said plurality of signal pins, a second transfer gate connected between another of said plurality of signal lines and said associated one of said plurality of signal pins and an inverter for generating a complementary control signal of associated one of said control signals, and said complementary signal and said associated one of said control signals are supplied to said first transfer gate and said second transfer gate for complementarily changing said first and second transfer gates between on-state and off-state.

7. The semiconductor device as set forth in claim 6, in which each of said first and second transfer gates is implemented by a parallel combination of a p-channel enhancement type switching transistor and an n-channel enhancement type switching transistor.

8. The semiconductor device as set forth in claim 1, in which said internal circuit has a plurality of memory cell arrays respectively connected to said signal lines.

* * * * *